US008107542B1

(12) United States Patent  
Lou et al.

(10) Patent No.: US 8,107,542 B1  
(45) Date of Patent: Jan. 31, 2012

(54) SOFT DECODING OF CODED BIT-STREAMS

(75) Inventors: Hui-ling Lou, Palo Alto, CA (US); Dimitrios-Alexandros Toumpakaris, Sunnyvale, CA (US); Jungwon Lee, Stanford, CA (US)

(73) Assignee: Marvell International Ltd., Hamilton (BM)

( * ) Notice: Subject to any disclaimer, the term of this patent is extended or adjusted under 35 U.S.C. 154(b) by 2201 days.

(21) Appl. No.: 10/923,066

(22) Filed: Aug. 20, 2004

Related U.S. Application Data

(60) Provisional application No. 60/562,757, filed on Apr. 16, 2004.

(51) Int. Cl.  
*H04L 25/00* (2006.01)

(52) U.S. Cl. .......................................... 375/259; 375/341

(58) Field of Classification Search .................. 375/259, 375/341, 147, 375, 130, 150, 262, 349; 714/796  
See application file for complete search history.

(56) References Cited

U.S. PATENT DOCUMENTS

| | | | | |
|---|---|---|---|---|
| 4,641,318 A * | 2/1987 | Addeo | ............................ | 375/260 |
| 5,694,438 A * | 12/1997 | Wang et al. | .................... | 375/347 |
| 5,727,029 A * | 3/1998 | Jeon et al. | ..................... | 375/341 |
| 5,852,630 A * | 12/1998 | Langberg et al. | ............. | 375/219 |
| 6,111,912 A * | 8/2000 | Cohen et al. | ................... | 375/225 |
| 6,175,590 B1 * | 1/2001 | Stein | .............................. | 375/225 |
| 6,345,377 B1 * | 2/2002 | Kroeger et al. | ............... | 714/790 |
| 6,507,619 B1 * | 1/2003 | Thomson et al. | ............. | 375/241 |
| 6,615,386 B2 * | 9/2003 | Yano et al. | ..................... | 714/780 |
| 7,046,719 B2 * | 5/2006 | Chen et al. | ..................... | 375/147 |
| 7,234,100 B1 * | 6/2007 | Sadowsky | ...................... | 714/792 |
| 7,237,179 B2 * | 6/2007 | Yoon et al. | ..................... | 714/774 |
| 7,437,654 B2 * | 10/2008 | Das et al. | ....................... | 714/790 |
| 7,590,624 B2 * | 9/2009 | Shipley et al. | ........................ | 1/1 |
| 2001/0020287 A1 * | 9/2001 | Yano et al. | ..................... | 714/780 |
| 2003/0171121 A1 * | 9/2003 | Kim et al. | ..................... | 455/451 |
| 2005/0243774 A1 * | 11/2005 | Choi et al. | ..................... | 370/335 |

OTHER PUBLICATIONS

Nee et al., "OFDM Wireless Multimedia Communications", Library of Congress Cataloging-in-Publication Data, 3.4 Quadrature Amplitude Modulation, pp. 60-67.

"HD Radio™ Air Interface Design Description—Layer 1 FM", iBiquity Digital Corporation, Mar. 12, 2004, Rev. C.1, pp. 1-110, Glossary pp. 1-5.

* cited by examiner

*Primary Examiner* — Shuwang Liu  
*Assistant Examiner* — Helene Tayong

(57) ABSTRACT

A wireless system may transmit multiple bit streams representing the same information but with the coded bits being transmitted with different repeat transmission factors. The receiver may derive appropriate combining metrics to optimize decoder performance, while eliminating complicated multiplication operations. The receiver may utilize different soft combining metrics for different bit-to-symbols mappings and types of channels, e.g., additive white Gaussian noise (AWGN) and Rayleigh fading channels.

52 Claims, 7 Drawing Sheets

SOFT DECODING OF CODED BIT-STREAMS

CROSS-REFERENCE TO RELATED APPLICATIONS

This application claims priority to U.S. Provisional Application Ser. No. 60/562,757, filed on Apr. 16, 2004.

BACKGROUND

A signal transmitted over a wireless communication channel may be subject to channel noise such as additive white Gaussian noise (AWGN), Rayleigh fading or even blockage. Therefore, many wireless communication systems transmit multiple bit-streams that represent the same information over different time periods, frequencies, or spatially separated antennas to introduce time diversity, frequency diversity, or spatial diversity, respectively, in order to maximize the chance of detecting the information correctly at the receiver. In particular, the multiple streams may be encoded using channel encoders of different rates and with different amounts of redundancies. At the receiver, transmitted bit-streams that are corrupted by noise in the communication channels have to be combined appropriately to maximize the chances that the decoder can reconstruct the original information in the data bit-stream correctly.

SUMMARY

A wireless system may transmit multiple bit streams representing the same information but with the coded bits being transmitted with different repeat transmission factors. The receiver may identify the repeated coded bits with a repeat factor N and derive appropriate combining metrics to optimize decoder performance. A decoder in the receiver may decode the combined coded bits using a decision metrics that is a factor of N.

The receiver may utilize different soft combining metrics for different bit-to-symbols mappings and types of channels, e.g., additive white Gaussian noise (AWGN) and Rayleigh fading channels. For example, for an AWGN channel using QPSK bit-to-symbol mapping, the decision metric may be a branch metric, and for 16-QAM and higher constellation mappings, the decision metric may be a bit metric. Similarly, for a Rayleigh fading channel using QPSK bit-to-symbol mapping, the decision metric may be a branch metric, and for 16-QAM and higher constellation mappings, the decision metric may be a bit metric.

DETAILED DESCRIPTION

A wireless communication system may transmit multiple bit-streams that represent the same information over different time periods, frequencies, or spatially separated antennas to introduce time diversity, frequency diversity, or spatial diversity, respectively, in order to maximize the chance of detecting the information correctly at the receiver. The multiple streams may be encoded using channel encoders of different rates and with different amounts of redundancies. At the receiver, transmitted bit-streams that are corrupted by noise in the communication channels have to be combined appropriately to maximize the chances that the decoder can reconstruct the original information in the data bit-stream correctly.

In an embodiment, soft combining metrics may be derived for these multiple transmitted bit-streams encoded using channel encoders of different rates with different amounts of redundancies to maximize the chances that a decoder such as a hard-decision decoder or a Viterbi decoder can decode the data bit-stream correctly.

Figure 1:
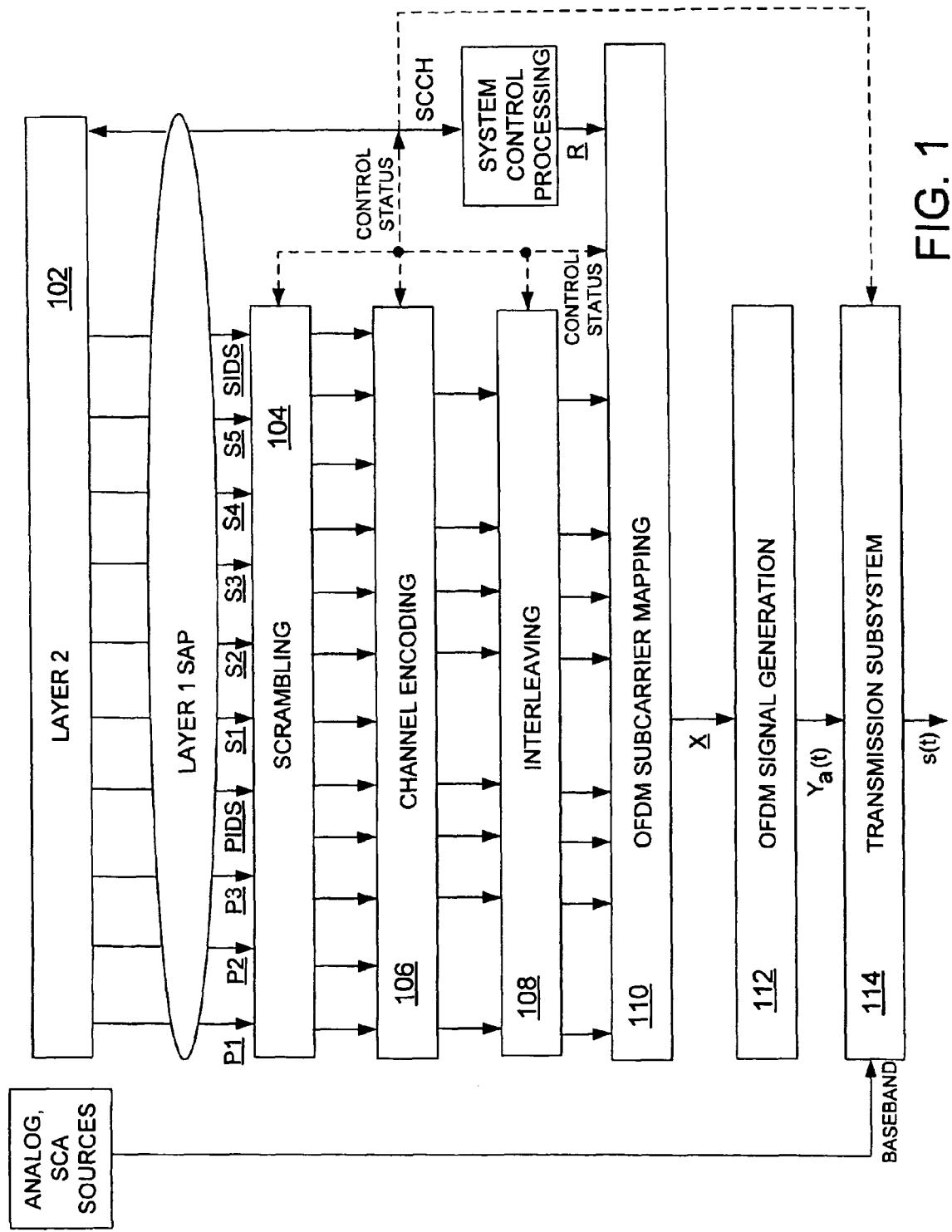
FIG. 1 is a block diagram of the physical layer of an In-Band On-Channel (IBOC)-frequency modulation (FM) transmitter.

In an embodiment, the soft combining metrics may be derived for a multi-rate multi-stream transmission scheme, such as an In-Band On-Channel (IBOC)-frequency modulation (FM) system. FIG. 1 is a functional block diagram of the physical layer of an IBOC-FM transmitter. The digital data bit-stream from Layer 2 102 of the five IBOC layers is first passed through a scrambler 104 before being sent into a channel encoder 106 that introduces redundancy to protect the bits from noise and fading in the channel. The coded frames of bits are then passed through interleavers 108 and are mapped to Quadrature Phase Shift Keying (QPSK) symbols in a mapping module 110 before being assigned to OFDM subcarriers. An OFDM signal generator 112 performs an Inverse Discrete Fourier Transform and appends a cyclic prefix to form an OFDM symbol in the time domain, which is then passed to a transmission subsystem 114, which formats the baseband waveform for transmission through the wireless channel.

Figure 2:
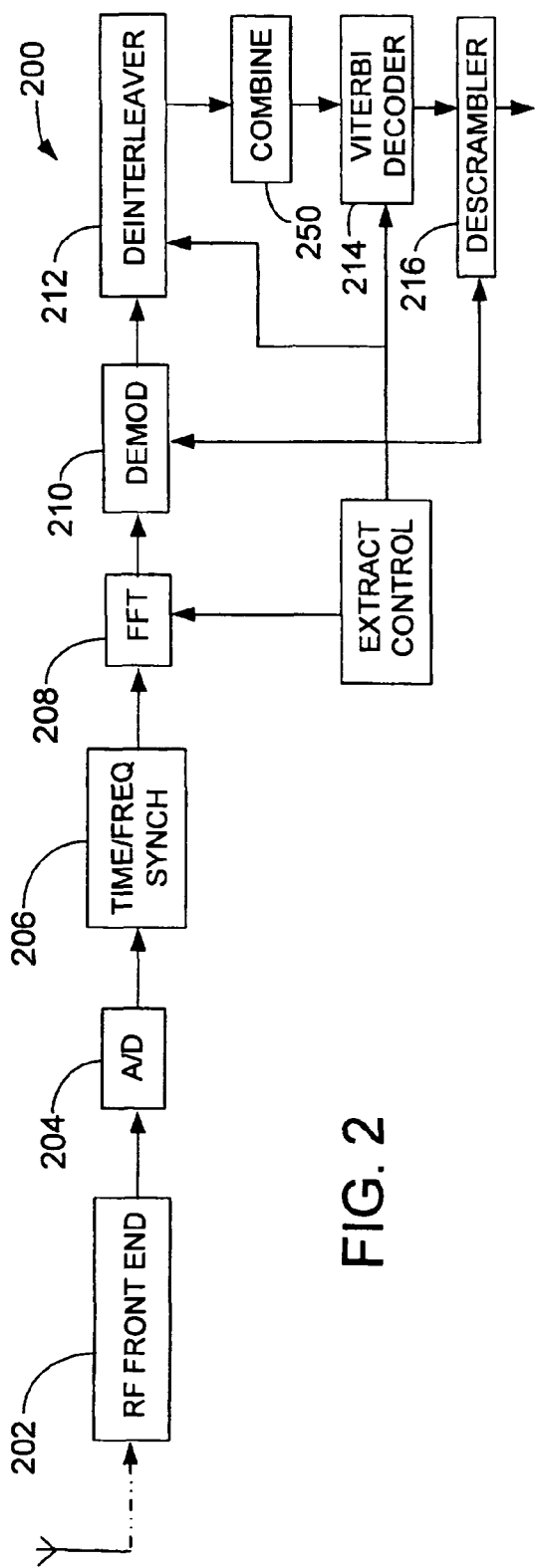
FIG. 2 shows an IBOC-FM receiver according to an embodiment.

FIG. 2 is a block diagram to illustrate the functions of an IBOC-FM receiver 200 according to an embodiment. Received signals are down-converted by an RF front end 202 in a receiver processing chain and converted to digital signals by an analog-to-digital converter (A/D) 204. A module 206 performs time and frequency synchronization operations. The receiver detects the bit-stream by performing the inverse operations used in the transmitter. A transform module 208 performs a fast Fourier transform (FFT). The signal is then demodulated and deinterleaved by modules 210 and 212, respectively. A Viterbi decoder 214 decodes the bit-stream, which is then descrambled by descrambler 216.

Figure 3:
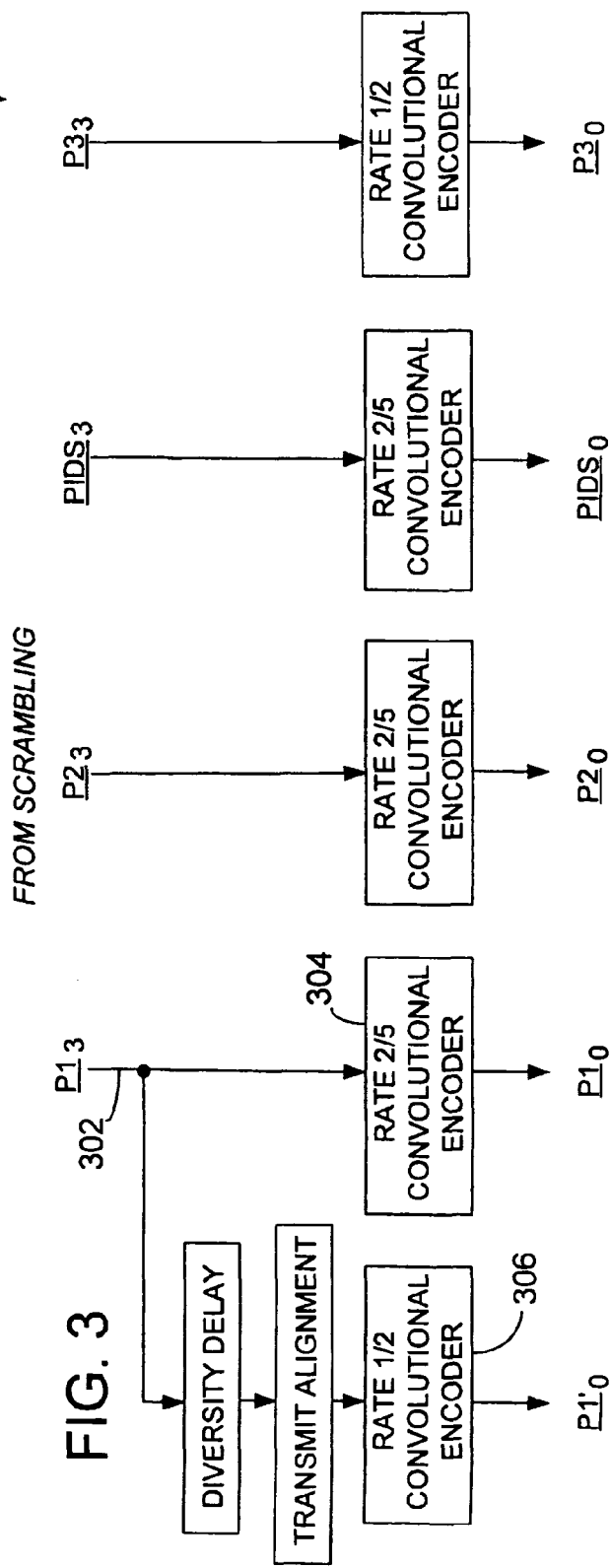
FIG. 3 is a block diagram of logical channels in the channel encoder in the IBOC-FM transmitter.

The channel encoder 106 in the transmitter may encode bit-streams using a rate-1/3, rate-2/5, rate-1/2, or rate-2/7 convolutional code. The rate used for a particular input data bit-stream may be dependent on the service mode. For primary service modes such as MP5, the bit-stream contained in the logical channel P1 302 is encoded using both a rate-2/5 convolutional encoder 304 and a rate-1/2 convolutional encoder 306, as shown in FIG. 3. The coded bit-stream that is coded using the rate-1/2 convolutional code will be transmitted with a delay equal to the diversity delay time specified by the system. This introduces time diversity for the two bit-streams transmitted over the channels in order to increase the likelihood that the decoder can have a better chance of detecting the data input bit-stream. Therefore, the receiver needs to determine a method to combine the two received bit-streams that correspond to the rate-1/2 and rate-2/5 convolutional encoders.

Figure 4A:
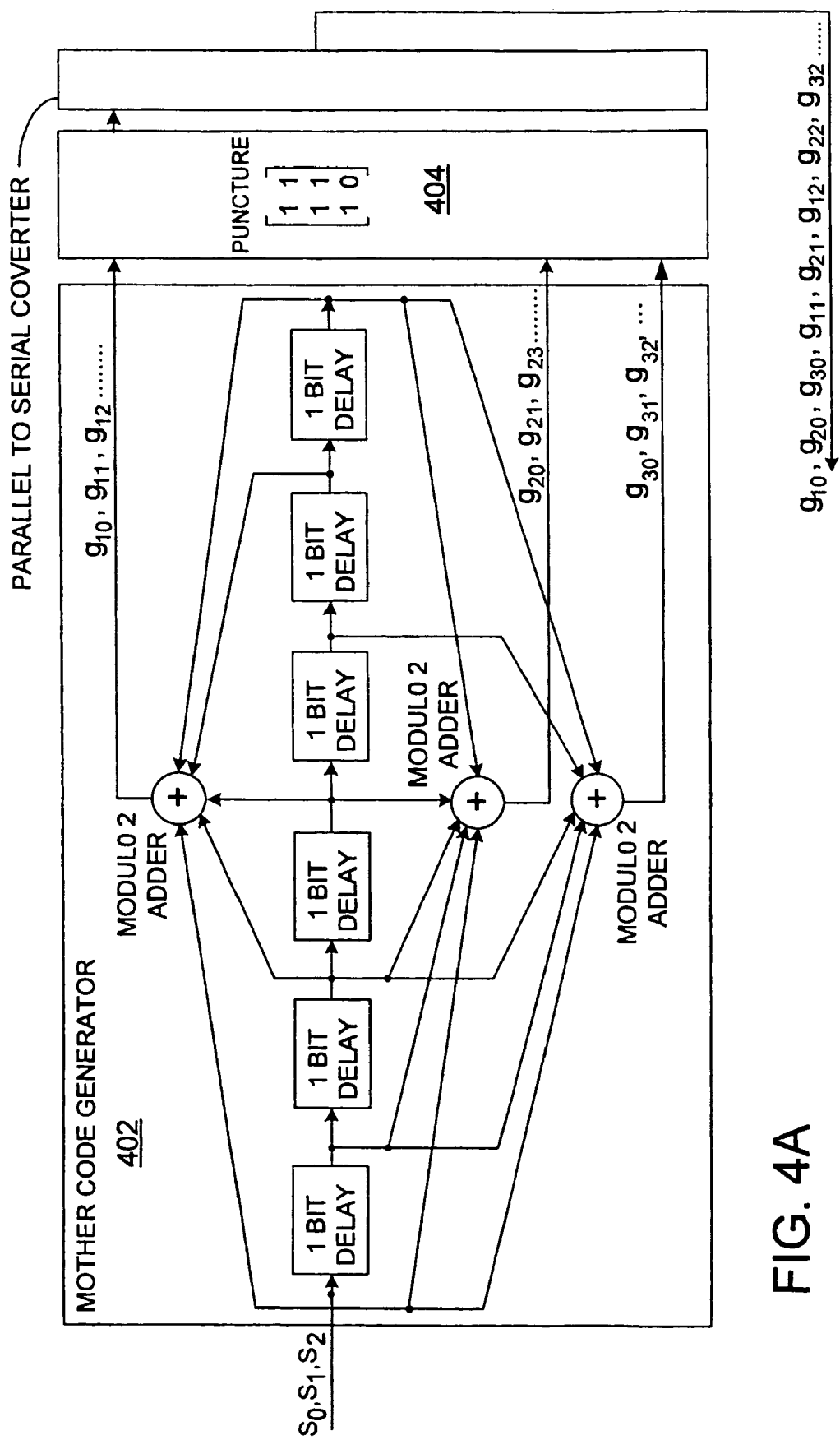
FIG. 4A is a block diagram of a rate-2/5 convolutional encoder.
Figure 4B:
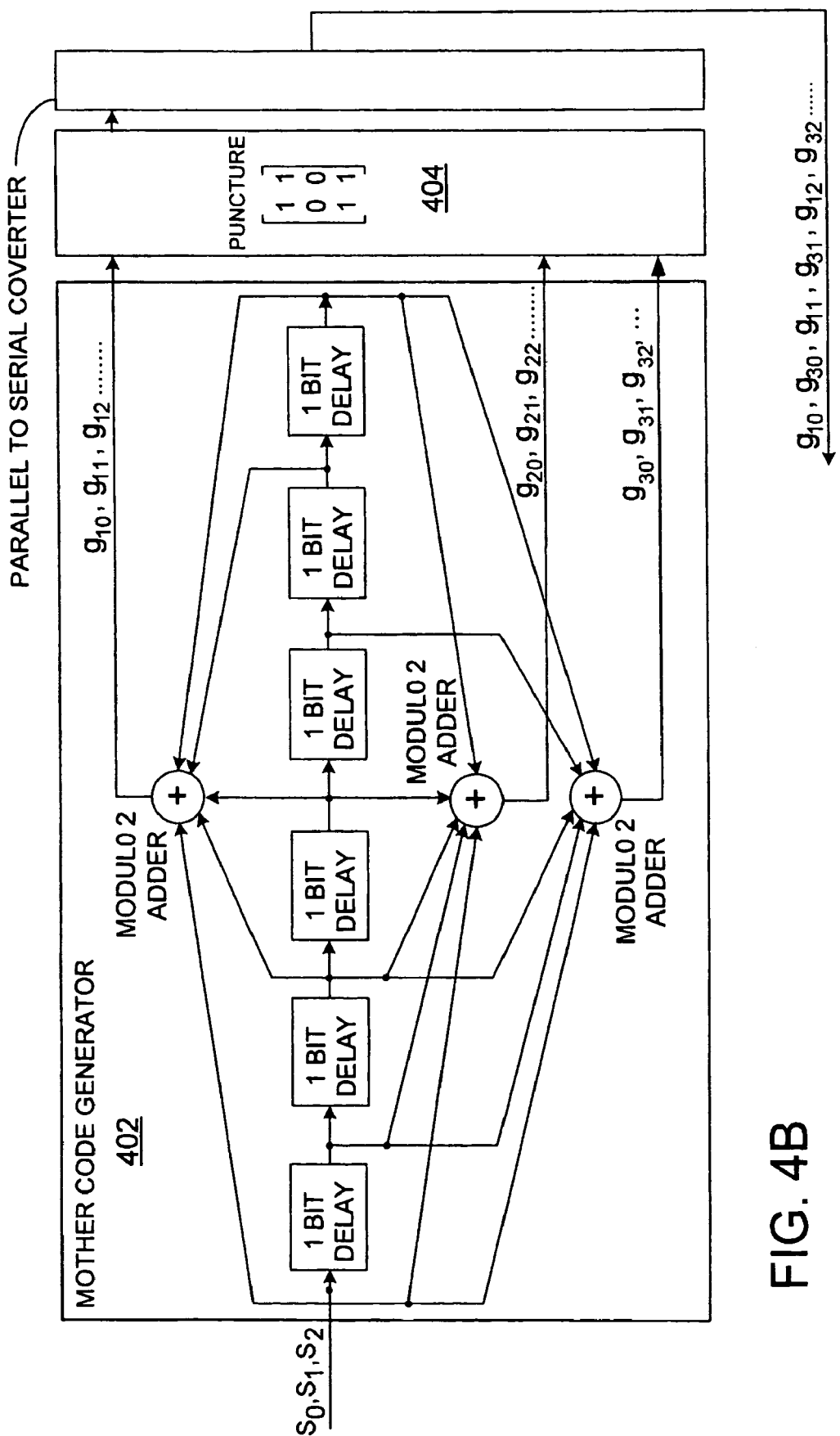
FIG. 4B is a block diagram of a rate-1/2 convolutional encoder.

The rate-1/2 and 2/5 convolutional encoders are shown in FIGS. 4A and 4B, respectively. A bit-stream from P1 is sent through both of the encoders. In this case, both encoders share the same rate-1/3 "Mother code" generator 402. For the rate-2/5 code, one output bit out of every six output bits from the rate-1/3 convolutional encoder 402 is not transmitted. This bit is commonly known as the punctured bit, which is removed by a puncture module 404. For example, bit $g_{31}$ at the output of the rate-1/3 encoder 402 shown in FIG. 4A is not transmitted. That is, for every two input bits sent into the rate-1/3 convolutional encoder, five out of the six output bits from the encoder are sent. Therefore, effectively, a rate-2/5 coded bit-stream is obtained. The transmitted bits are $\{g_{1,0}, g_{2,0}, g_{3,0}, g_{1,1}, g_{1,2}, g_{1,2}\}$. Similarly, as can also be seen in FIG. 4B, for the rate-1/2 coded bit-stream only four out of Six encoded bits at the output of the rate-1/3 encoder 402 are transmitted. The transmitted bits are $\{g_{1,0}, g_{3,0}, g_{1,1}, g_{3,1}, g_{1,2}, g_{3,2}, \ldots\}$. The rate-2/5 and rate-1/2 coded bit-streams are sent through channels that may corrupt the data by noise. At the receiver, the two noisy bit-streams may be combined in order to optimize the decoder performance.

The decoder is commonly implemented using the Viterbi algorithm, which is an efficient way to perform maximum-likelihood sequence estimation. In an embodiment, soft combining metrics are derived and implemented to optimize the performance of the Viterbi decoder and also introduce efficient implementation methods.

Soft Combining Metrics for Symbols Transmitted in AWGN Channels

In the following description, the received noisy symbols corresponding to the rate-2/5 convolutional encoded bit-stream are denoted as $\bar{g} = \{\bar{g}_{1,0}, \bar{g}_{2,0}, \bar{g}_{3,0}, \bar{g}_{1,1}, \bar{g}_{2,1}, \bar{g}_{1,2}, \ldots\}$, and the received noisy symbols corresponding to the rate-1/2 convolutional encoded bit-stream are denoted as $\bar{f} = \{\bar{f}_{1,0}, \bar{f}_{3,0}, \bar{f}_{1,1}, \bar{f}_{3,1}, \bar{f}_{1,2}, \bar{f}_{3,2}, \ldots\}$. It is noted that even though a pair of two coded bits at the transmitter is mapped into a QPSK constellation symbol that contains two real numbers representing the in-phase (I) and quadrature (Q) dimensions, each real number may be decoded separately on a per dimension basis if the symbol is transmitted over an additive white Gaussian noise (AWGN) channel. For channels such as Rayleigh fading channels, demodulation may be performed on the received complex symbols before decoding on a per dimension basis in order to undo the phase rotation due to the channel effect.

In this example, the rate-2/5 and the rate-1/2 convolutional encoders are derived from the same rate-1/3 "mother code" with the same generator polynomials "133", "171" and "165". Furthermore, symbols such as $\bar{f}_{1,0}$ and $\bar{g}_{1,0}$ correspond to the same coded bit in the same data sequence which is encoded using the same generator polynomial "133". That is, $\bar{f}_{1,0}$ and $\bar{g}_{1,0}$ correspond to the same bit position in the same branch of the Viterbi decoder. In essence, this coded bit $g_{1,0}$ is transmitted twice over the communication channel. Thus, $\bar{f}_{1,0}$ and $\bar{g}_{1,0}$ can be combined before computing the branch metrics. An intuitive combining scheme, given an AWGN channel, is to add the soft symbols. That is, for the IBOC example, computing $(\bar{g}_{1,0}+\bar{f}_{1,0})$, $(\bar{g}_{3,0}+\bar{f}_{3,0})$ and $(\bar{g}_{1,1}+\bar{f}_{1,1})$ for the three bits, $g_{1,0}$, $g_{3,0}$, and $g_{1,1}$, that are transmitted twice. Since bits such as $g_{20}$, $\mu g_{21}$, and $g_{31}$ are transmitted only once, no combining can be done. However, since some of the soft symbols can be combined while the others cannot be combined before the Viterbi decoder 214, the Viterbi decision metrics (also known as the branch metrics) have to be properly normalized so that the expected noise power in each branch is the same. To illustrate this, one can model the effects of an AWGN channel on a bit, say $g_{1,0}$, that is transmitted twice over two independent channels as:

$$\bar{g}_{1,0} = g_{1,0} + n_{1,0} \quad (1)$$

and $$\bar{f}_{1,0} = g_{1,0} + n_{1,0}' \quad (2)$$

where $n_{1,0}$ and $n_{1,0}'$ and $E(n^2) = E((n')^2) = \sigma^{-2}$. By adding the two soft symbols, $$z_{1,0} = \bar{g}_{1,0} + \bar{f}_{1,0} = 2g_{1,0} + n_{1,0} + n_{1,0}'. \quad (3)$$

Thus, the corresponding branch metric in the Viterbi decoder is $(z_{1,0} - 2g_{1,0})^2$. The noise power corresponding to this metric is $2\sigma^2$. On the other hand, for the coded bits that are transmitted once, such as bit $g_{2,0}$, the conventional branch metric, $(\bar{g}_{2,0} - g_{2,0})^2$, has an expected noise power of only $\sigma^2$. In order to give equal weight to each branch in the Viterbi decode and optimize the Viterbi decoder performance in general, the expected noise power for each branch should be the same. To normalize the noise power, the soft combining before sending to a conventional Viterbi decoder should be $$z_{i,j} = \frac{\bar{g}_{i,j} + \bar{f}_{i,j}}{\sqrt{2}} \quad (4)$$

for the two symbols corresponding to the same output bits from the same generating polynomial of the same data bit sequence. In this case, the expected power of the branch metric $(z_{i,j} - 2g_{2,0})^2$ is $\sigma^2$.

This concept may be generalized for normalized branch metrics for bits with varying repeat transmission factor. Consider a coded bit that is transmitted N times. The N received symbols that have gone through N independent AWGN channels may be denoted as $\bar{p}_k$, where $k=1, \ldots, N$. If these symbols correspond to the same output bit from the same generating polynomial fed by the same data bit sequence, then the soft combining metric should be, $$z = \frac{1}{\sqrt{N}} \sum_{k=1}^{N} \bar{p}_k. \quad (5)$$

The branch metrics corresponding to these symbols are,

Branch metric = $(z - \sqrt{N}a)^2$, (6)

where a is the encoded bit associated with the branch for which the branch metric is to be computed. For example, $a \in \{\pm 1\}$ for QPSK, and $a \in \{\pm 1, \pm 3\}$ for 16-QAM.

The $$\frac{1}{\sqrt{N}}$$

normalization factor is necessary only if some of the coded bits are transmitted only once while the others are repeated N times. Therefore, the expected noise power contained in each branch of the branch metrics may be different unless proper normalization is applied. In the conventional repeat transmission scheme where all the bits in a coded bit sequence are transmitted N times, no normalization factor is required since the branch metric computed from the sum of the N received soft symbols for every coded bit will contain the same expected noise power, albeit N times larger.

In practice, multiplying the soft, combined values with a factor of $\sqrt{N}$ can be complex to implement. However, in an embodiment, these multiplications may be avoided and the branch metric computation can be simplified without loss in performance. A combining module 250 (FIG. 2) may combine the repeated soft symbols prior to decoding by the Viterbi decoder 214 using a decision metric that does not require multiplication by the normalization factor, as described below.

The branch metric in Equation 6 can be expanded as $$\text{Branch metric} = z^2 - 2\sqrt{N}za + Na^2. \tag{7}$$

Since $z^2$ is common to all the branch metrics to be compared in the Viterbi decoder, this term can be eliminated without affecting the comparison result. By substituting Equation 5 to Equation 7 and eliminating the $z^2$ term, $$\text{Branch metric} = -2a \sum_{k=1}^{N} \overline{p}_k + Na^2 \tag{8}$$

Therefore, by combining the soft symbols without multiplying with the normalization factor, $$y = \sum_{k=1}^{N} \overline{p}_k, \tag{9}$$

the equivalent branch metric for bits that are transmitted N times becomes $$\text{Branch metric} = -2ay + Na^2. \tag{10}$$

Thus, no multiplication with $\sqrt{N}$ is required if y is formed and Equation 10 is used. For QPSK, $a \in \{\pm 1\}$, and the branch metrics can be simplified further to $$\text{Branch metric for QPSK} = -ay. \tag{11}$$

For systems using higher modulation schemes such as 16-QAM and 64-QAM, each one-dimensional symbol corresponds to two or more coded bits. For example, two coded bits are mapped to each dimension of a 16-QAM symbol. For such systems, the bit metric may be computed for each bit rather than the branch metric for one symbol. This way, if only one of the coded bits in a constellation symbol is repeatedly transmitted, the bit metric for that bit can be computed before combining it with the bit metrics of the other bits that are mapped to the same symbol to form the branch metric for that symbol. Even if all the coded bits mapped to a constellation symbol are transmitted the same number of times, bit-metric computation is typically simpler to implement than branch metric computation, albeit with potential performance loss.

Figure 5:
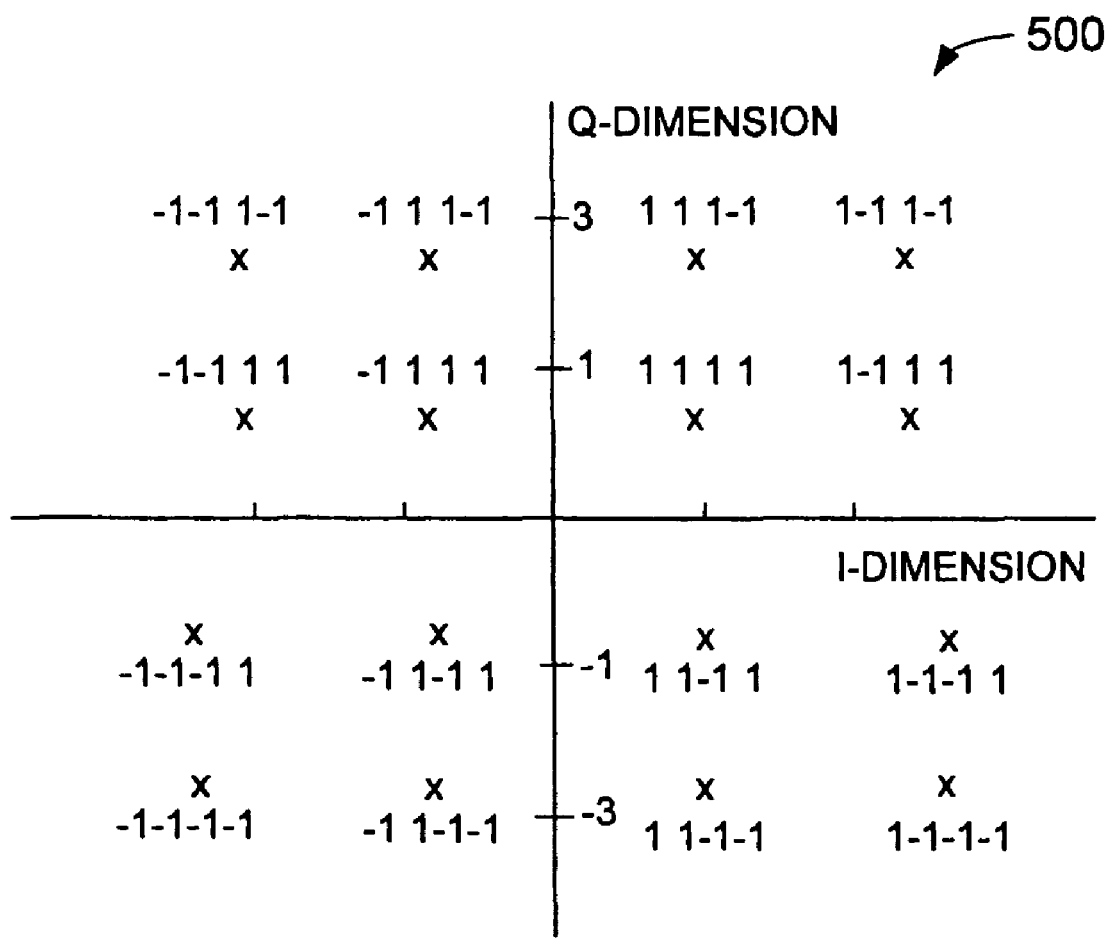
FIG. 5 shows a 16-QAM bit-to-symbol mapping.
Figure 6:
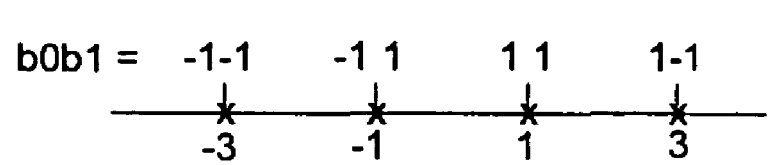
FIG. 6 shows a four-level Pulse Amplitude Modulation (PAM) constellation.

The bit metrics can be derived by extending a bit-by-bit linear piecewise approximation approach. For illustration, a 16-QAM bit-to-symbol mapping 500 is shown in FIG. 5. Since the mappings of the I-dimension and Q-dimension are symmetric, only one dimension needs to be considered. The one-dimensional constellation is the same as a four-level Pulse Amplitude Modulation (PAM) constellation 600, as shown in FIG. 6. For a QPSK or QAM symbol transmitted over an AWGN channel, each one dimensional I- or Q-value can be used to compute its bit metrics for bits b0 and b1 separately. For symbols that are transmitted N times, Equation 9 may be used to compute y. The branch metric for QPSK with $a \in \{\pm 1\}$ is $$\text{Branch metric} = \pm y. \tag{12}$$

Figure 7:
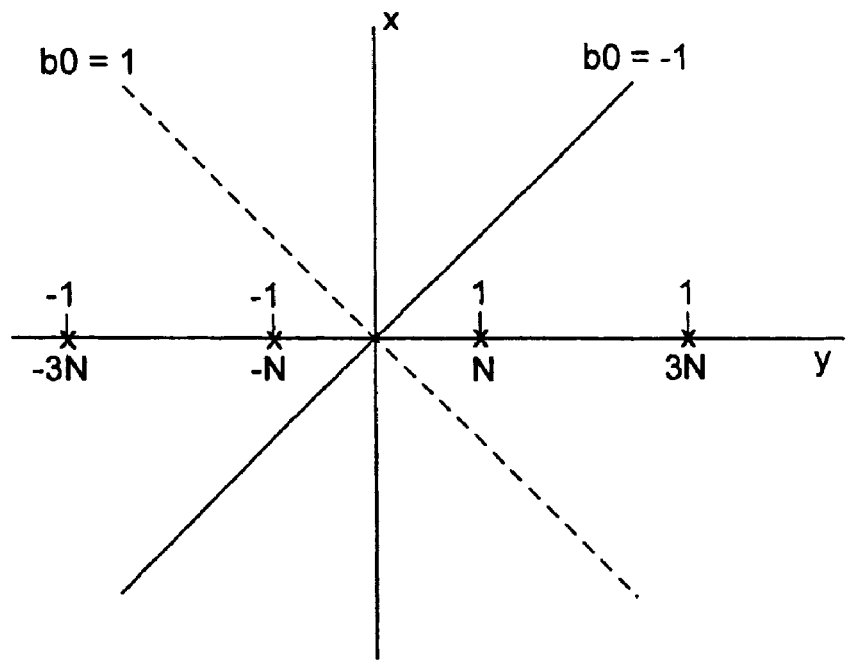
FIG. 7 shows a bit metric computation for bit b0 in a 16-QAM constellation.
Figure 8:
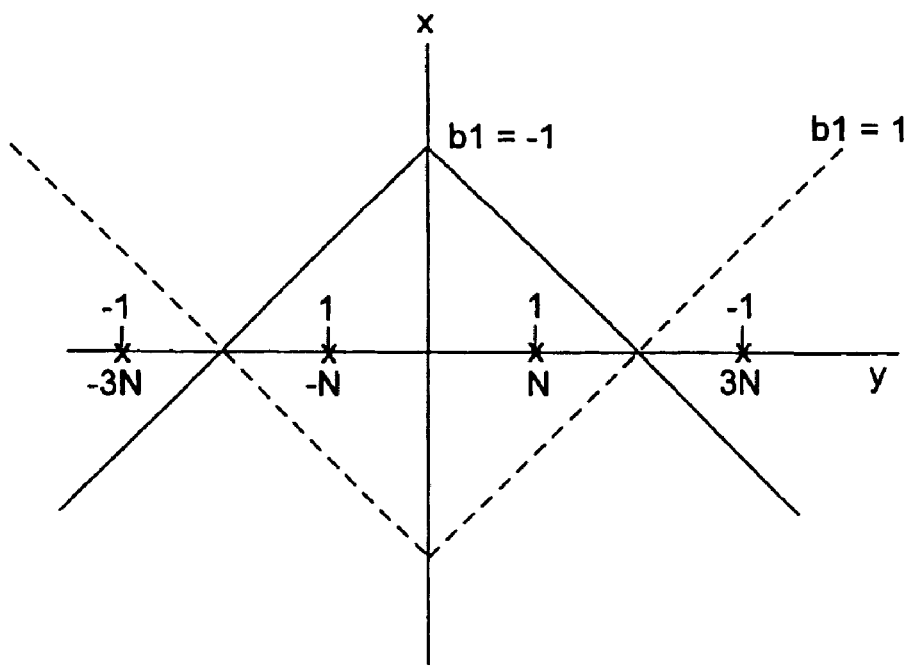
FIG. 8 shows a bit metric computation for bit b1 in a 16-QAM constellation.

Extending this to bit metrics, the slope of the bit metric is either +1 or −1 and the constellation points should be placed at Na where $a \in \{\pm 1, \pm 3\}$ for 16-QAM. The bit metric computation for bits b0 and b1 in a 16-QAM constellation are shown in FIGS. 7 and 8. That is, if y=N, the bit metric for b0=−1 is N and for b0=1 is −N. For bit b1, the bit metric (BM) can be expressed as $$BM = (|y| - Nm)\text{sign}(b1), \tag{13}$$

where $m \in \{\pm 2\}$ and N is the number of repeat transmissions. The bits-to-symbol mapping is system dependent. Thus, the sign of a bit metric should be modified accordingly. For example, if one uses another Gray mapping scheme that maps the symbols ±1 to b1=−1 and symbols ±3 to b1=1, the bit metric will become, $$BM = -(|y| - Nm)\text{sign}(b1). \tag{14}$$

Similar to the 16-QAM case, one can extend the conventional bit metric computation for a 64-QAM constellation and the piece-wise bit metric for b1 and b2 will be of the form $$BM = \pm(|y| - Nm) \tag{15}$$

where $m \in \{\pm 2, \pm 4\}$ and N is the number of repeat transmissions. That is, slicing and linear distances are used for the bit metrics. No multiplications are required to implement the operations because Nm may be implemented using shift-and-add operations in hardware rather than multiplications. This may be simpler to compute than the conventional metrics given in Equations 6 and 10. Given the derivation of a 16-QAM constellation presented in this section, the bit metrics can be derived for larger constellations.

Soft Decoding Metrics for Symbols Transmitted Over Rayleigh Fading Channels

This section derives bit metrics for symbols transmitted over a Rayleigh fading channel. For a constellation symbol x that is transmitted over a Rayleigh fading channel, one can model the received symbol $$q = Hx + n, \tag{16}$$

where H is Rayleigh distributed and n is the AWGN. For a symbol that is transmitted over N independent channels let $z_k$ denote the k-th received symbol for k=0, 1, 2, . . . , N−1, and $H_k$ denote the channel response of Rayleigh fading channel k. Then, maximum ratio combining (MRC) can be used to form a combined received symbol. Denoting the combined symbol using MRC as w, $$w = \frac{\sum_{k=0}^{N-1} H_k^* z_k}{\sum_{k=0}^{N-1} |H_k|^2}. \tag{17}$$

However, as is discussed above in the AWGN case, in order to normalize the noise power, the soft combining metrics should be, $$w = \frac{\sum_{k=0}^{N-1} H_k^* z_k}{\sqrt{\sum_{k=0}^{N-1} |H_k|^2}} \quad (18)$$

Again, similar to the derivation for Equations 9 and 10, and assuming that the channel estimates at the receiver are perfect, the symbols $z_k$ can be demodulated using $$y = \sum_{k=0}^{N-1} H_k^* z_k \quad (19)$$

and the branch metric expression can be derived to be $$\text{Branch metric} = -2ay + a^2 \sum_{k=0}^{N-1} |H_k|^2 \quad (20)$$

After demodulation, the phase rotation effect due to the channel is undone and the I-dimension and Q-dimension of y can be processed separately on a per dimension basis. For QPSK, the branch metric is $$\text{Branch metric} = -ay. \quad (21)$$

The bit metric derivation can be extended for higher modulation schemes as described above regarding Equations 12 to 15 for the AWGN channel given in the previous section. That is, the bit metrics for bits transmitted over N Rayleigh fading channels will be of the form $$BM = \pm y \quad (22)$$

or $$BM = \pm(|y| - \bar{H}m), \quad (23)$$

where $$\bar{H} = \sum_{k=0}^{N-1} |H_k|^2$$

and $m \in \{\pm 2\}$ for 16-QAM and $m \in \{\pm 2, \pm 4\}$ for 64-QAM. Bit metrics for larger constellations can be derived accordingly.

Soft Combining Bit Metrics for BICM

For systems that use bit-interleaved convolutional modulation (BICM) such as the IBOC-FM system, a coded bit at the output of a convolutional encoder may be mapped to different bit positions of a constellation symbol because there is an interleaver between the channel encoder and the bit-to-symbol mapping. For example, $g_{1,0}$ may be mapped to b0 and $f_{1,0}$ that corresponds to the same coded bit may be mapped to b1 of a 16-QAM constellation symbol. In this case, the bit metric has to be computed separately by setting N=1. The bit metric corresponding to bit $g_{1,0}$ is added to that of $f_{1,0}$ to form the combined bit metric that is used in a Viterbi decoder. To generalize, consider a coded bit q that is mapped to the same bit position, denoted bi, of a constellation symbol that is transmitted $N_1$ times. Suppose that q is also mapped to another bit position bj (i≠j) of a constellation symbol that is transmitted $N_2$ times. Then the $N_1$ received symbols corresponding to the bits that are mapped to bit bi should be combined and the bit metric may be computed with a repeat factor $N_1$, using either Equations 12 and 15 or Equations 22 and 23, depending on the channel. Similarly, the $N_2$ received symbols corresponding to the bits that are mapped to bit bj should be combined to compute the bit metric. The sum of the computed bit metrics is the bit metric for the coded bit q.

Figure 9:
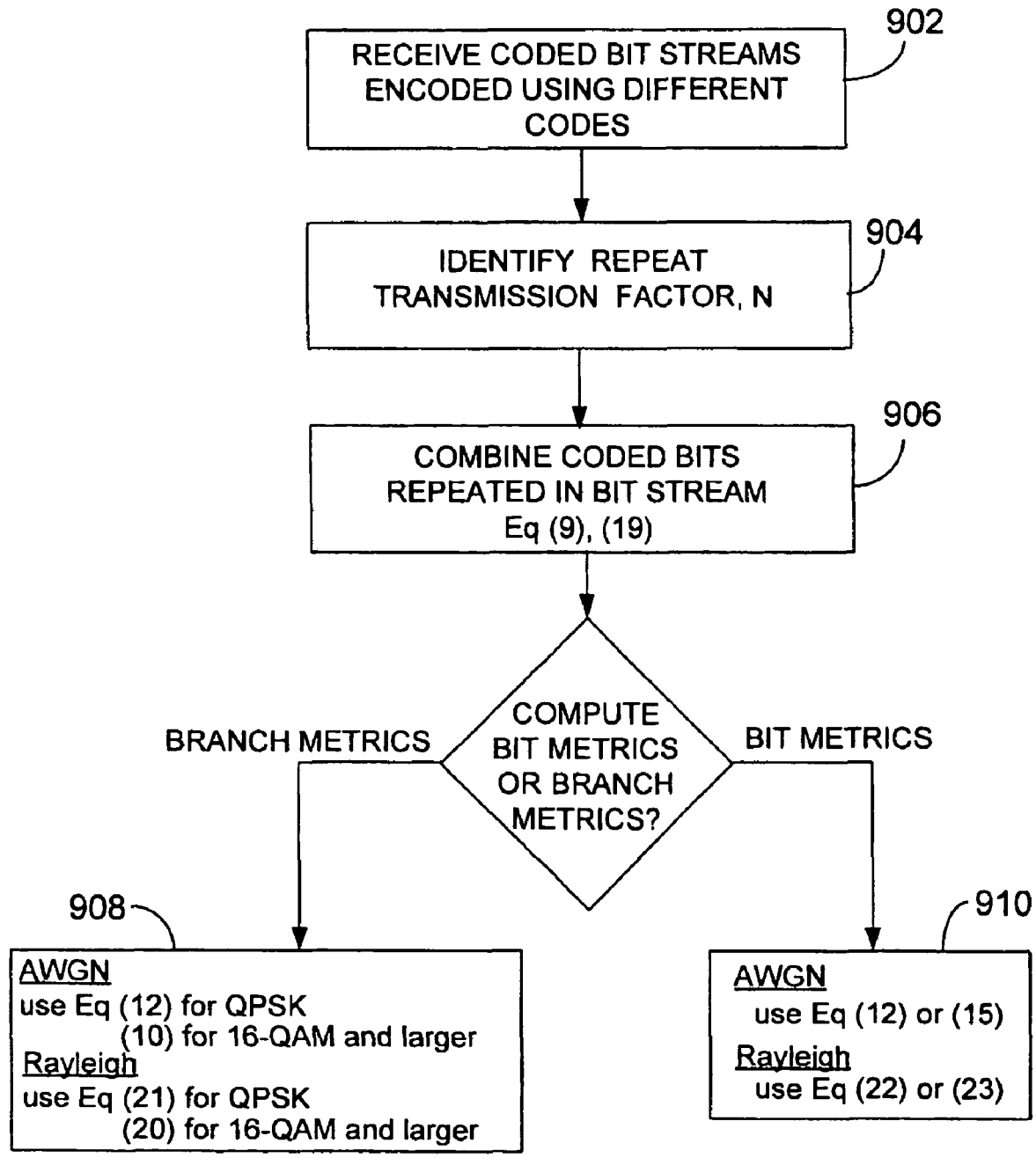
FIG. 9 is a flowchart describing a soft combining and decoding operation which may be performed by the receiver.

FIG. 9 is a flowchart describing a soft combining and decoding operation which may be performed by the receiver shown in FIG. 2. The receiver may receive a number of noisy bit streams which are encoded using different codes, which are based on the same mother code, such that certain coded bits are repeated N times (the "repeat transmission factor") in the bit streams (block 902). The receiver may identify the repeat transmission factor N for each of the coded bits (block 904). The combining module 250 may combine coded bits repeated in the bit streams (block 906), e.g., using Equation 9 or 19. The decoder may compute bit metrics or branch metrics, depending on the size of the constellation and desired performance and complexity trade-offs. The decoder may then decode the coded bits using a decision metric (e.g., branch metric (block 908) or bit metric (block 910)) appropriate for either an AWGN or Rayleigh fading channel.

A number of embodiments have been described. Nevertheless, it will be understood that various modifications may be made without departing from the spirit and scope of the invention. For example, blocks in the flowchart may be skipped or performed out of order and still produce desirable results. Accordingly, other embodiments are within the scope of the following claims.

The invention claimed is:

1. A method comprising:
   receiving, by a receiver, a plurality of bit streams, each of the bit streams including a plurality of coded bits and having an encoding rate, wherein at least two of said coded bits have a different repeat transmission factor, wherein the repeat transmission factor corresponds to a number of times one or more bits representing same information are transmitted;
   identify a plurality of repeated coded bits with a repeat factor N, where N>0, in the plurality of bit streams corresponding to a same coded bit in a sequence;
   combining the plurality of repeated coded bits; and
   decoding, using a decoder, the identified repeated coded bits using a decision metric that is a function of N and a sum of the combined coded bits, wherein the decision metric comprises a branch metric or a bit metric.

2. The method of claim 1, further comprising combining the repeated coded bits without multiplying by a normalization factor.

3. The method of claim 1, wherein said at least two of said coded bits in different transmitted bit streams are generated from a common encoding generator polynomial.

4. The method of claim 1, wherein the plurality of bits streams are received on additive white Gaussian noise (AWGN) channels.

5. The method of claim 4, wherein the decision metric comprises the branch metric, and, wherein the branch metric equals $-2ay + Na^2$, where y comprises the sum of the combined coded bits, N comprises the number of times the coded bit is repeated, and a comprises an encoded bit associated with a branch for which the branch metric is to be computed.

6. The method of claim 4, wherein the decision metric comprises the bit metric, and wherein the coded bits in the plurality of bit streams are mapped to symbols using a 16-QAM bit-to-symbol mapping.

7. The method of claim 6, wherein the bit metric equals $\pm y$ or $-(|y|-Nm)\text{sign}(b1)$, where y comprises the sum of the combined coded bits, N comprises the number of times the coded bit is repeated, b1 comprises the coded bit, and $m \in \{\pm 2\}$.

8. The method of claim 4, wherein the bit metric equals $\pm y$ or $\pm(|y|-Nm)$, where y comprises the sum of the combined coded bits, N comprises the number of times the coded bit is repeated, and $m \in \{\pm 2, \pm 4\}$ for 64 QAM, $m \in \{\pm 2, \pm 4, \pm 6\}$ for 256 QAM, and $m \in \{\pm 2, \pm 4, \ldots, \pm 2k\}$ for higher constellations, where k depends on the size of the constellation.

9. The method of claim 1, wherein the plurality of bits streams are received on Rayleigh fading channels.

10. The method of claim 9, wherein the branch metric equals $$-2ay + a^2 \sum_{k=0}^{N-1} |H_k|^2,$$

where y comprises the sum of the repeated coded bits, N comprises the number of times the coded bit is repeated, a comprises an encoded bit associated with a branch for which the branch metric is to be computed, and $|H_k|$ comprises a Rayleigh distribution.

11. The method of claim 9, wherein the decision metric comprises the bit metric, and wherein the coded bits in the plurality of bit streams are mapped to symbols using a 16-QAM bit-to-symbol mapping.

12. The method of claim 11, wherein the bit metric equals $\pm y$ or $\pm(|y|-\overline{H}m)$, where $$\overline{H} = \sum_{k=0}^{N-1} |H_k|^2,$$

$|H_k|$ comprises a Rayleigh distribution, y comprises the sum of the combined coded bits, N comprises the number of times the coded bit is repeated, and $m \in \{\pm 2\}$.

13. The method of claim 11, wherein the decision metric comprise the bit metric, and, wherein the bit metric equals $\pm y$ or $\pm(|y|-\overline{H}m)$, where $$\overline{H} = \sum_{k=0}^{N-1} |H_k|^2,$$

$|H_k|$ comprises a Rayleigh distribution, y comprises the sum of the combined coded bits, N comprises the number of times the coded bit is repeated, and $m \in \{\pm 2, \pm 4\}$ for 64 QAM, $m \in \{\pm 2, \pm 4, \pm 6\}$ for 256 QAM, and $m \in \{\pm 2, \pm 4, \ldots, \pm 2k\}$ for higher constellations, where k depends on the size of the constellation.

14. An apparatus comprising:
a receiver processing chain to process a plurality of received bit streams, each of the bit streams including a plurality of coded bits and having an encoding rate, wherein at least two of said coded bits have a different repeat transmission factor N, where N>0, and wherein the repeat transmission factor corresponds to a number of times one or more bits representing same information are transmitted;

a combining module to identify a plurality of repeated coded bits in the plurality of bit streams corresponding to a same coded bit in a data sequence and combine the repeated coded bits; and a decoder to decode the combined coded bits using a decision metric that is a function of N and a sum of the combined coded bits, wherein the decision metric comprises a branch metric or a bit metric.

15. The apparatus of claim 14, wherein the combining module is operative to combine the repeated coded bits without multiplying by a normalization factor.

16. The apparatus of claim 14, wherein said at least two of said bit streams are generated from a common encoding rate.

17. The apparatus of claim 14, wherein the plurality of bits streams are received on additive white Gaussian noise (AWGN) channels.

18. The apparatus of claim 17, wherein the decision metric comprises the branch metric, and, wherein the branch metric equals $\pm y$ or $-2ay + Na^2$, where y comprises the sum of the combined coded bits, N comprises the number of times the coded bit is repeated, and a comprises an encoded bit associated with a branch for which the branch metric is to be computed.

19. The apparatus of claim 17, wherein the decision metric comprises the bit metric, and, wherein the coded bits in the plurality of bit streams are mapped to symbols using a 16-QAM bit-to-symbol mapping.

20. The apparatus of claim 19, wherein the bit metric equals $\pm y$ or $\pm(|y|-Nm)$, where y comprises the sum of the combined coded bits, N comprises the number of times the coded bit is repeated, and $m \in \{\pm 2\}$.

21. The apparatus of claim 17, wherein the decision metric comprises the bit metric, and, wherein the bit metric equals $\pm y$ or $\pm(|y|-Nm)$, where y comprises the sum of the combined coded bits, N comprises the number of times the coded bit is repeated, and $m \in \{\pm 2, \pm 4\}$ for 64 QAM, $m \in \{\pm 2, \pm 4, \pm 6\}$ for 256 QAM, and $m \in \{\pm 2, \pm 4, \ldots, \pm 2k\}$ for higher constellations, where k depends on the size of the constellation.

22. The apparatus of claim 14, wherein the plurality of bits streams are received on Rayleigh fading channels.

23. The apparatus of claim 22, wherein the branch metric equals $$-2ay + a^2 \sum_{k=0}^{N-1} |H_k|^2,$$

where y comprises the sum of the repeated coded bits, N comprises the number of times the coded bit is repeated, a comprises an encoded bit associated with a branch for which the branch metric is to be computed, and $|H_k|$ comprises a Rayleigh distribution.

24. The apparatus of claim 22, wherein the decision metric comprises the bit metric, and, wherein the coded bits in the plurality of bit streams are mapped to symbols using a 16-QAM bit-to-symbol mapping.

25. The apparatus of claim 24, wherein the bit metric equals $\pm y$ or $\pm(|y|-\overline{H}m)$, where $$\overline{H} = \sum_{k=0}^{N-1} |H_k|^2,$$

$|H_k|$ comprises a Rayleigh distribution, y comprises the sum of the combined coded bits, N comprises the number of times the coded bit is repeated, and $m \in \{\pm 2\}$.

26. The apparatus of claim 22, wherein the decision metric comprises the bit metric, and wherein the bit metric equals $\pm(|y|-\overline{H}m)$, where $$\overline{H} = \sum_{k=0}^{N-1} |H_k|^2,$$

$|H_k|$ comprises a Rayleigh distribution, y comprises the sum of the combined coded bits, N comprises the number of times the coded bit is repeated, and $m \in \{\pm 2, \pm 4\}$ for 64 QAM, $m \in \{\pm 2, \pm 4, \pm 6\}$ for 256 QAM, and $m \in \{\pm 2, \pm 4, \ldots, \pm 2k\}$ for higher constellations, where k depends on the size of the constellation.

27. An apparatus comprising:
   means for processing a plurality of received bit streams, each of the bit streams including a plurality of coded bits and having an encoding rate, wherein at least two of said coded bits have a different repeat transmission factor N, where N>0, wherein the repeat transmission factor corresponds to a number of times one or more bits representing same information are transmitted;
   means for identifying a plurality of repeated coded bits in the plurality of bit streams corresponding to a same coded bit in a data sequence;
   means for combining the repeated coded bits; and
   means for decoding the combined coded bits using a decision metric that is a function of N and a sum of the combined coded bits, wherein the decision metric comprises a branch metric or a bit metric.

28. The apparatus of claim 27, wherein the means for combining comprises means for combining the repeated coded bits without multiplying by a normalization factor.

29. The apparatus of claim 27, wherein said at least two of said bit streams are generated from a common encoding rate.

30. The apparatus of claim 27, wherein the plurality of bits streams are received on additive white Gaussian noise (AWGN) channels.

31. The apparatus of claim 30, wherein the decision metric comprises the branch metric, and, wherein the branch metric equals $-2ay+Na^2$, where y comprises the sum of the combined coded bits, N comprises the number of times the coded bit is repeated, and a comprises an encoded bit associated with a branch for which the branch metric is to be computed.

32. The apparatus of claim 30, wherein the decision metric is the bit metric, and wherein the coded bits in the plurality of bit streams are mapped to symbols using a 16-QAM bit-to-symbol mapping.

33. The apparatus of claim 32, wherein the bit metric equals $\pm y$ or $\pm(|y|-Nm)$, where y comprises the sum of the combined coded bits, N comprises the number of times the coded bit is repeated, and $m \in \{\pm 2\}$.

34. The apparatus of claim 30, wherein the decision metric is the bit metric, and, wherein the bit metric equals $\pm y$ or $\pm(|y|-Nm)$, where y comprises the sum of the combined coded bits, N comprises the number of times the coded bit is repeated, and $m \in \{\pm 2, \pm 4\}$ for 64 QAM, $m \in \{\pm 2, \pm 4, \pm 6\}$ for 256 QAM, and $m \in \{\pm 2, \pm 4, \ldots, \pm 2k\}$ for higher constellations, where k depends on the size of the constellation.

35. The apparatus of claim 27, wherein the plurality of bits streams are received on Rayleigh fading channels.

36. The apparatus of claim 35, wherein the branch metric equals $$-2ay + a^2 \sum_{k=0}^{N-1} |H_k|^2,$$

where y comprises the sum of the repeated coded bits, N comprises the number of times the coded bit is repeated, a comprises an encoded bit associated with a branch for which the branch metric is to be computed, and $|H_k|$ comprises a Rayleigh distribution.

37. The apparatus of claim 35, wherein the decision metric comprises the bit metric, and wherein the coded bits in the plurality of bit streams are mapped to symbols using a 16-QAM bit-to-symbol mapping.

38. The apparatus of claim 37, wherein the bit metric equals $\pm y$ or $\pm(|y|-\overline{H}m)$, where $$\overline{H} = \sum_{k=0}^{N-1} |H_k|^2,$$

$|H_k|$ comprises a Rayleigh distribution, y comprises the sum of the combined coded bits, N comprises the number of times the coded bit is repeated, and $m \in \{\pm 2\}$.

39. The apparatus of claim 35, wherein the bit metric equals $\pm y$ or $\pm(|y|-\overline{H}m)$, where $$\overline{H} = \sum_{k=0}^{N-1} |H_k|^2,$$

$|H_k|$ comprises a Rayleigh distribution, y comprises the sum of the combined coded bits, N comprises the number of times the coded bit is repeated, and $m \in \{\pm 2, \pm 4\}$ for 64 QAM, $m \in \{\pm 2, \pm 4, \pm 6\}$ for 256 QAM, and $m \in \{\pm 2, \pm 4, \ldots, \pm 2k\}$ for higher constellations, where k depends on the size of the constellation.

40. A non-transitory computer-readable medium having instructions stored thereon, which, when executed by a processor, causes the processor to perform operations comprising:
   receiving a plurality of bit streams, each of the bit streams including a plurality of coded bits and having an encoding rate, wherein at least two of said coded bits have a different repeat transmission factor, wherein the repeat transmission factor corresponds to a number of times one or more bits representing same information are transmitted;
   identifying a plurality of repeated coded bits with a repeat factor N, where N>0, in the plurality of bit streams corresponding to a same coded bit in a data sequence;
   combining the plurality of repeated coded bits; and
   decoding the identified repeated coded bits using a decision metric that is a function of N and a sum of the combined coded bits, wherein the decision metric comprises a branch metric or a bit metric.

41. The non-transitory computer-readable medium of claim 40, further comprising combining the repeated coded bits without multiplying by a normalization factor.

42. The non-transitory computer-readable medium of claim 40, wherein said at least two of said coded bits in different transmitted bit streams are generated from a common encoding generator polynomial.

43. The non-transitory computer-readable medium of claim 40, wherein the plurality of bits streams are received on additive white Gaussian noise (AWGN) channels.

44. The non-transitory computer-readable medium of claim 43, wherein the decision metric comprises the branch metric, and, wherein the branch metric equals $-2ay+Na^2$, where y comprises the sum of the combined coded bits, N comprises the number of times the coded bit is repeated, and a comprises an encoded bit associated with a branch for which the branch metric is to be computed.

45. The non-transitory computer-readable medium of claim 43, wherein the decision metric comprises the bit metric, and wherein the coded bits in the plurality of bit streams are mapped to symbols using a 16-QAM bit-to-symbol mapping.

46. The non-transitory computer-readable medium of claim 45, wherein the bit metric equals $\pm y$ or $-(|y|-Nm)\text{sign}(b1)$, where y comprises the sum of the combined coded bits, N comprises the number of times the coded bit is repeated, b1 comprises the coded bit, and $m \in \{\pm 2\}$.

47. The non-transitory computer-readable medium of claim 43, wherein the decision metric comprises the bit metric, and, wherein the bit metric equals $\pm y$ or $\pm(|y|-Nm)$, where y comprises the sum of the combined coded bits, N comprises the number of times the coded bit is repeated, and $m \in \{\pm 2, \pm 4\}$ for 64 QAM, $m \in \{\pm 2, \pm 4, \pm 6\}$ for 256 QAM, and $m \in \{\pm 2, \pm 4, \ldots, \pm 2k\}$ for higher constellations, where k depends on the size of the constellation.

48. The non-transitory computer-readable medium of claim 40, wherein the plurality of bits streams are received on Rayleigh fading channels.

49. The non-transitory computer-readable medium of claim 48, wherein the branch metric equals $$-2ay + a^2 \sum_{k=0}^{N-1} |H_k|^2,$$

where y comprises the sum of the repeated coded bits, N comprises the number of times the coded bit is repeated, a comprises an encoded bit associated with a branch for which the branch metric is to be computed, and $|H_k|$ comprises a Rayleigh distribution.

50. The non-transitory computer-readable medium of claim 48, wherein the decision metric comprises the bit metric, and wherein the coded bits in the plurality of bit streams are mapped to symbols using a 16-QAM bit-to-symbol mapping.

51. The non-transitory computer-readable medium of claim 50, wherein the bit metric equals $\pm y$ or $\pm(|y|-\overline{H}m)$, where $$\overline{H} = \sum_{k=0}^{N-1} |H_k|^2,$$

$|H_k|$ comprises a Rayleigh distribution, y comprises the sum of the combined coded bits, N comprises the number of times the coded bit is repeated, and $m \in \{\pm 2\}$.

52. The non-transitory computer-readable medium of claim 48, wherein the decision metric comprises the bit metric, and, wherein the bit metric equals $\pm y$ or $\pm(|y|-\overline{H}m)$, where $$\overline{H} = \sum_{k=0}^{N-1} |H_k|^2,$$

$|H_k|$ comprises a Rayleigh distribution, y comprises the sum of the combined coded bits, N comprises the number of times the coded bit is repeated, and $m \in \{\pm 2, \pm 4\}$ for 64 QAM, $m \in \{\pm 2, \pm 4, \pm 6\}$ for 256 QAM, and $m \in \{\pm 2, \pm 4, \ldots, \pm 2k\}$ for higher constellations, where k depends on the size of the constellation.

* * * * *